US006815656B1

(12) United States Patent
Lauer

(10) Patent No.: US 6,815,656 B1
(45) Date of Patent: Nov. 9, 2004

(54) INTEGRATED OPTICAL CROSS-CONNECT AMPLIFIER

(76) Inventor: Mark A. Lauer, 1898 Brooktree Way, Pleasanton, CA (US) 94566

( * ) Notice: Subject to any disclaimer, the term of this patent is extended or adjusted under 35 U.S.C. 154(b) by 253 days.

(21) Appl. No.: 10/087,876

(22) Filed: Mar. 1, 2002

Related U.S. Application Data

(60) Provisional application No. 60/272,807, filed on Mar. 1, 2001.

(51) Int. Cl.$^7$ .............................................. H01J 40/14
(52) U.S. Cl. ................................ 250/214 LA; 359/872; 359/196; 359/333; 385/18
(58) Field of Search ..................... 250/214 LA, 227.11, 250/214 LS, 216; 398/55, 56, 160; 359/291, 295, 224, 333, 337.2, 337.21, 337.22, 872, 290, 196, 344; 385/16–18

(56) References Cited

U.S. PATENT DOCUMENTS

| 5,321,714 A | 6/1994 | Paoli ............................ 372/50 |
| 5,521,754 A | 5/1996 | Nitta et al. .................. 359/344 |
| 6,081,020 A | 6/2000 | Frahm et al. ................ 257/458 |
| 6,122,417 A | 9/2000 | Jayaraman et al. ........... 385/24 |
| 6,148,016 A | 11/2000 | Hegblom et al. ............. 372/50 |
| 6,163,557 A | 12/2000 | Dunnrowicz et al. ......... 372/46 |
| 6,174,749 B1 | 1/2001 | Yuen et al. .................... 438/35 |
| 6,445,495 B1 * | 9/2002 | Walker et al. ............... 359/344 |
| 2002/0097952 A1 * | 7/2002 | Jin et al. ...................... 385/18 |

OTHER PUBLICATIONS

OE Reports article entitled "MEMS enables fast, reliable optical switching", by P. Gwynne, copyright 2000 SPIE–The International Society for Optical Engineering, 3 pages, printed Feb. 27, 2002.

SPIE Web article entitled "MEMS has benefits for single–mode fiber alignment and lasers", R. W. Hardin, copyright 2000 SPIE–The International Society for Optical Engineering, 6 pages, printed Jan. 31, 2001.

IEEE Journal of Quantum Electronics article entitled "Long Wavelength Vertical–Cavity Semiconductor Optical Amplifiers", E. Staffan et al., pp. 274–281, vol. 37, No. 2, Feb. 2001.

IEEE Journal of Quantum Electronics article entitled "Design and Analysis of Vertical–Cavity Semiconductor Optical Amplifiers", J. Piprek et al., pp. 127–134, vol. 37, No. 1, Jan. 2001.

IEEE Photonics Technology Letters article entitled "1.3–$\mu$m Vertical–Cavity Amplifier", E. S. Björlin et al., pp. 951–953, vol. 12, No. 8, Aug. 2000.

Article entitled "The Future of MEMS in telecommunications networks", by J. A. Walker, J. Micromech. Microeng. 10 (2000) R1–R7. Printed in the UK.

Article entitled "Research breakthrough for fiber optic communications: single–crystal semiconductor lasers grown in one step will function as low–cost transmitters", contact: J. Savani, University of California, Santa Barbara–Engineering, Sep. 25, 2000, printed Feb. 26, 2001.

MEAM550 Modeling and Design of MEMS, Fall 2001, Mechanical Engineering and Applied Mechanics, University of Pennsylvania, Case Study entitled 2–axis Micromirror for Use in Optical Switching Applications, 6 pages, printed Feb. 27, 2002.

* cited by examiner

*Primary Examiner*—David Porta
*Assistant Examiner*—Stephen Yam

(57) ABSTRACT

A vertical cavity optical amplifier can tilt to reflect light in different directions. An array of such amplifiers can serve as an optical cross-connect.

20 Claims, 2 Drawing Sheets

INTEGRATED OPTICAL CROSS-CONNECT AMPLIFIER

CROSS-REFERENCE TO RELATED APPLICATIONS

The present application claims the benefit under 35 U.S.C. §119(e) of Provisional Patent Application Ser. No. 60/272,807, filed Mar. 1, 2001, by the same inventor. The disclosure of that Provisional Patent Application is incorporated by reference herein.

TECHNICAL FIELD

The present invention relates to optical components and systems, such as amplifiers, switches, mirrors, detectors, lasers, and communication systems including such devices.

BACKGROUND

Conventional optical communication systems employ optical signals traveling in optical fibers. It is possible, especially for short-range communications, to dedicate an optical fiber to communication between two end points. Such a dedicated fiber results in an inefficient use of capacity or bandwidth, however, during the time that it is not in use for conveying information between the end points. Routing of signals can provide a more efficient use of bandwidth. To route such optical signals, however, the optical signals must typically be converted to electrical signals and then back to optical signals. This conversion slows the transmission of the optical signals being routed.

Increasing demand for greater communications bandwidth is driving the need for elaborate and vast data-handling optical networks. More sophisticated techniques are being employed to increase the capacity and speed of data transfer between different points on the network. Dense wavelength division multiplexing (DWDM) has enabled greater amounts of data to be carried by a single fiber-optic cable. This includes the ability to combine and extract optical signals through the use of add/drop devices. Additionally, optical amplifiers and signal conditioners are needed to maintain the optical signal quality during transmissions over long lengths of fiber-optic cable. Many of these advances in long-haul transmission have outpaced the ability to route and process these high-capacity datastreams.

As mentioned above, conventional technology relies on optical-electrical-optical (OEO) conversion to route data from one fiber to another. Increased cable capacity is exceeding the ability to efficiently network or route the signals to their destinations. Since the electrical segment of the OEO conversion is inherently slower than the optical segment, there is a desire to develop a faster all-optical network switching router.

There have been many different techniques to develop these all-optical switching routers or optical cross-connects (OXC). These devices propose to enable the arbitrary switching of many optical input channels to many output channels. MEMS cross-connect fabrics such as those developed by AT&T Labs and Lucent Technologies use micro-mirrors to deflect the beams from input to output channels.

Signal loss, signal manipulation and other optical networking devices require optical amplification to compensate for the losses. Typically such amplification is performed with edge emitting amplifiers, or for long wavelength signals, erbium doped optical fibers.

SUMMARY

In accordance with the present invention, a device is disclosed comprising a substrate with at least one solid-state optical amplifier attached to the substrate, a plurality of mirrors attached to the substrate and moveable relative to the substrate independent of each other, wherein light having a wavelength within a selected range enters the device, is amplified by the amplifier and reflected by one of the mirrors to exit the device in a direction controlled by the mirror. This brief summary merely lists a few possible features of the invention, which is described in more detail below.

DETAILED DESCRIPTION OF THE PREFERRED EMBODIMENTS

Figure 1:
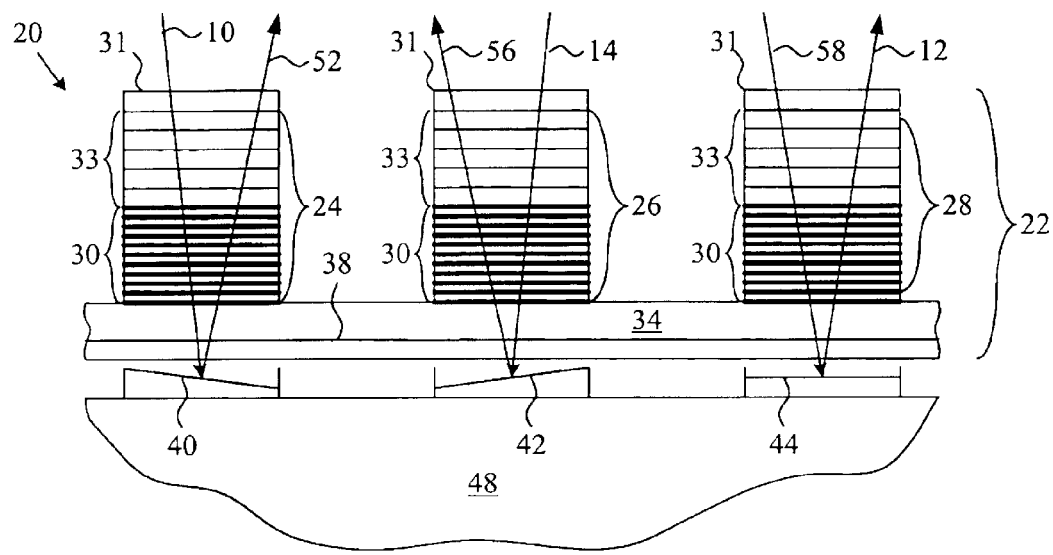
FIG. 1 is a cross-sectional view of a device that reflects and amplifies light.

FIG. 1 is a cross-sectional view of a device that reflects and amplifies light. The light being amplified may also be read as an electronic signal that may be used for routing, such as redirecting the light. In this application, the term light is used to mean electromagnetic waves in the infrared and ultraviolet range, as well as visible light. The device 20 includes a body 22 that is substantially transparent to the light being manipulated. The body has a plurality of amplifiers 24, 26, and 28, that each have gain regions 30 that may include one or more quantum wells.

A plurality of moveable mirrors 40, 42 and 44 are aligned with amplifiers 24, 26 and 28, respectively. The mirrors 40, 42 and 44 can tilt about one or two axes, and may be controlled by electrostatic or magnetic fields, as is known in the art of micromirror or cross-connect devices. The mirrors are attached to and may have been formed on a substrate 48. A plurality of Bragg reflector layers 33 may be formed to assist in amplifying light.

In operation, light such as optical signals passes through the gain regions 30 and is amplified before and after reflection by the mirrors 40, 42 and 44 in directions controlled by the mirrors. Light may exit from one optical device and be reflected by one of the mirrors 40, 42 and 44 to enter another optical device, as determined by the angle of the mirror relative to the light.

A first light beam 10, which may emerge from a first optical fiber, is amplified by amplifier 24 and reflected by mirror 40 to emanate from device 20 as an amplified first light beam 52, which may enter a second optical fiber. Similarly, a second light beam 14 which may emerge from a third optical fiber, is amplified by amplifier 26 and reflected by mirror 42 to emanate from device 20 as an amplified second light beam 56, which may enter a fourth optical fiber. Likewise, a third light beam 58, which may emerge from a fifth optical fiber, is amplified by amplifier 28 and reflected by mirror 42 to emanate from device 20 as an amplified third light beam 12, which may enter a sixth optical fiber. In this manner thousands of light beams may be simultaneously switched and amplified by device 20.

Mirrors 40, 42 and 44 may be formed on substrate 48, which may include silicon dioxide, gallium arsenide or other known substrate materials, by known MEMS techniques, to enable titling of the mirrors in one or two dimensions. Body 22 may be separately formed by epitaxial growth on another substrate, which may then be removed from body 22, for example by lapping and polishing. Body 22 may then be attached to substrate 48, for example with a ring that is seated near the perimeter of substrate 48 and body 22, and additional spacing material may be provided between the mirrors. It is also possible to form a photodetector in substrate 48 beneath each of the mirrors 40, 42 and 44, so that light that passes through the mirrors is detected as a signal by the photodetectors. The photodetectors in this case should be formed of similar materials as will be described below for body 22, to enable detection of similar frequencies of light as that amplified by device 20.

To form body 22, a GaAs substrate 34 is used to grow the components of an active optical gain medium 30 comprised of an InP-based material (InAsP/InGaP/InGaAsP, etc.). A sufficient number of stacked multiple quantum wells are deposited to yield high single-pass gain in gain regions 30. The overlying Bragg reflector 33 includes alternating layers of GaAs and Al(Ga)As in this embodiment. The reflectivity of the Bragg reflector is adjusted by the number and spacing of the layers to yield sufficient gain and output for the application yet precludes any unwanted free-lasing action. An optical cavity is created in the region between the mirror 40 and the Bragg reflector 33.

Conventional metal organic chemical vapor deposition (MOCVD) and molecular beam epitaxy (MBE) techniques can be employed to form Bragg reflector 33 and gain regions 30 including quantum wells. Most of the substrate 34 can then be removed by etching and polishing, for example. Anti-reflective layers 31 and 38 can then be formed, after which the body 22 is etched by ion-beam etching (IBE) or reactive ion etching (RIE) to isolate amplifiers 24, 26 and 28. The body 22 can be optically pumped with light of higher frequencies than that being amplified, for example with a number of lasers or diodes located around the perimeter of body 22.

Figure 2:
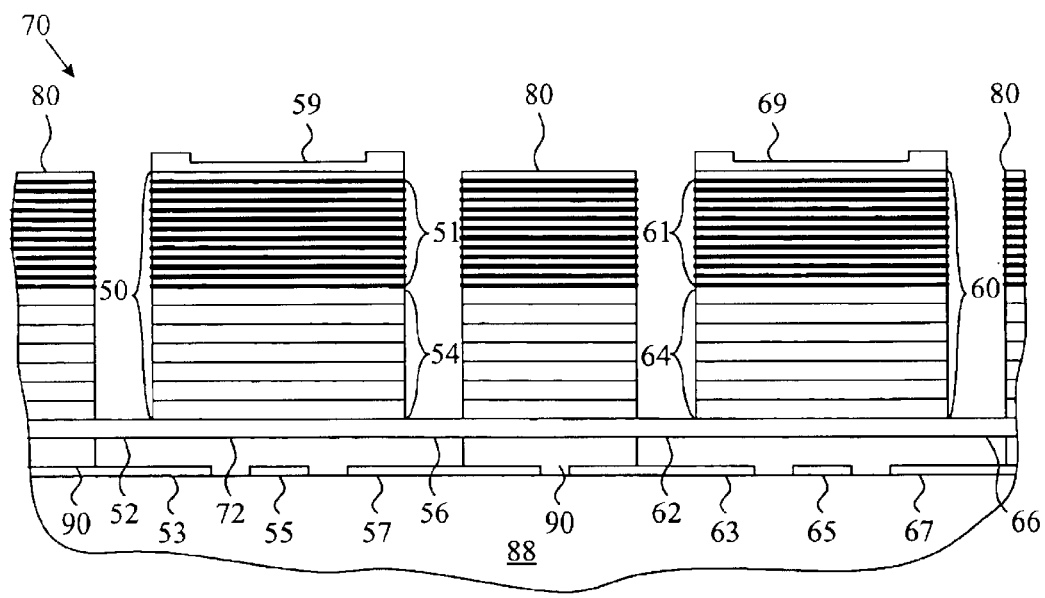
FIG. 2 is a cross-sectional view of a pair of tilting mirror amplifiers.

In the embodiment shown in FIG. 2, tilting mirror amplifiers 50 and 60 are part of a cross-connect amplifier 70. Amplifier 50 has a high gain material 51 including a stack of quantum wells and amplifier 60 has a gain material 61 including a stack of quantum wells. Optional Bragg mirrors 54 and 64 may be included in amplifiers 50 and 60, respectively. A conductive mirror layer 72 is common to amplifiers 50 and 60, the conductive layer also providing torsion bars 52 and 56 that also serve as leads 52 and 56 connecting amplifier 50 with support structure 80, and torsion bars 62 and 66 that also serve as leads 62 and 66 connecting amplifier 50 with support structure 80, as seen additionally in FIG. 3.

Figure 3:
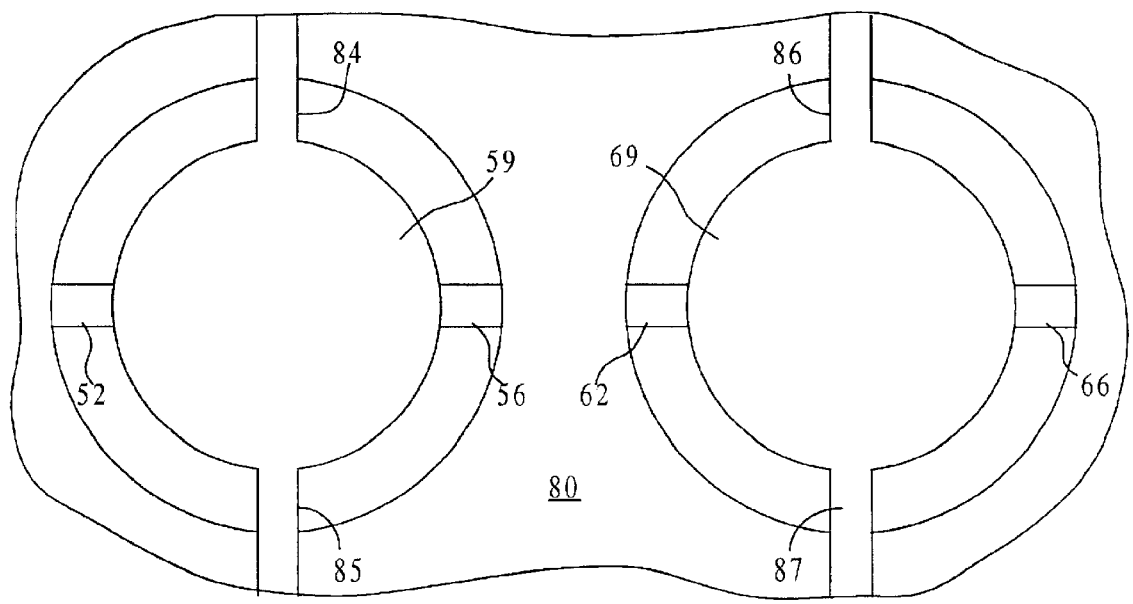
FIG. 3 is a top view of the amplifiers of FIG. 2.

Conductive layer 72 is spaced apart from tilt electrodes 53, 55 and 57, which along with another tilt electrode, not shown, electrically control the angle of amplifier 50 relative to support 80. Conductive layer 72 is also spaced apart from tilt electrodes 63, 65 and 67, which along with another tilt electrode, not shown, electrically control the angle of amplifier 70 relative to support 80. A transparent electrode 59 is formed atop amplifier 50, and another transparent electrode 69 is formed atop amplifier 60. Electrode 59 has a thin central region and a thicker perimeter that is connected with torsion bar leads 84 and 85 that extend perpendicular to leads 52 and 56, as seen in FIG. 3. Similarly, electrode 69 has a thin central region and a thicker perimeter that is connected with torsion bar leads 86 and 87 that extend perpendicular to leads 62 and 66. An antireflective layer may be formed atop electrodes 59 and 69.

Conductors 59 and 72 bracket gain region 51, biasing the gain region to emit light that amplifies an incoming optical signal, both before and after reflection by mirrors 54. Similarly, conductors 69 and 72 bracket gain region 61, biasing the gain region to emit light that amplifies another incoming optical signal, both before and after reflection by mirrors 64. The stacks of multiple quantum wells 51 and 61 enhance this effect.

The current drawn by conductors 59 and 69 can be monitored as an indication of the optical signals. For example, the optical signals may be in the form of packets of information for which packet headers indicate routing information. Some packets of information may be used to set up a connection, such as a voice, video or data connection, over which the data for the connection then flows, after which the connection is terminated. Establishing and terminating connections can be performed by tilting amplifiers 50 and 60 to couple amplified light between different optical fibers or waveguides.

To form cross-connect amplifier 70, a substrate 88 is coated with a conductive material such as gold or copper that is patterned to create tilt electrodes such as electrodes 53, 55, 57, 63, 65 and 67. A sacrificial layer may be formed over those electrodes, for example of silicon dioxide. A base 90 for support 80 is formed for example of gallium arsenide, with the base and sacrificial layer then polished to form a flat surface. Conductive layer 72 is then formed, for example of a metal or doped semiconductor such as gallium arsenide. Conductive layer 72 may be patterned to create torsion bars such as bars 52, 56, 62 and 66 at this time, with another sacrificial layer formed around the torsion bars, for example of silicon dioxide. The conductive layers and second sacrificial layer are then polished to form a flat surface.

Bragg reflector layers that will become Bragg mirrors 54 and 64 are then optionally formed. High gain material including quantum well layers that will become gain regions 51 and 61 is then formed. The wafer is then masked and etched, for example by IBE or RIE, to separate amplifiers 50 and 60 from support 80, the etching terminating at conductive layer 70. A filler material such as photoresist is then deposited in the spaces separating amplifiers 50 and 60 from support 80, the photoresist hardened by baking and then smoothed to be substantially coplanar with the tops of amplifiers 50 and 60. Another conductive layer is then formed, for example of a metal or doped semiconductor such as gallium arsenide, which will form electrodes 59 and 69 and torsion bars 84–87. Central portions of the electrodes are then thinned, and the electrodes are then patterned, for example by masking and IBE or RIE to form bars 84–87. The photoresist is then chemically removed, followed by etching of the sacrificial layer surrounding bars 52, 56, 62 and 66 and etching of the sacrificial layer disposed between conductor 72 and the tilt electrodes 53, 55, 57, 63, 65 and 67.

Figure 4:
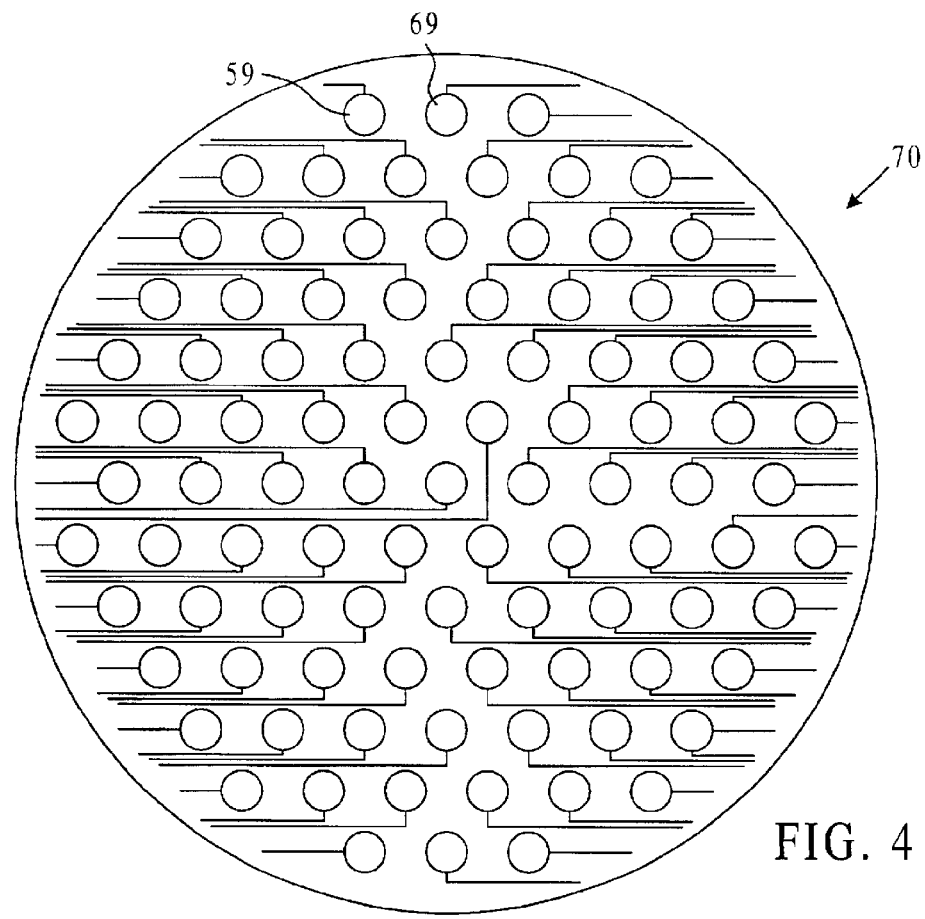
FIG. 4 is a top view of cross-connect amplifier array including the amplifiers of FIG. 2.

FIG. 4 shows a top view of cross-connect amplifier 70. For clarity only the top conductors 59 and 69 are shown, and only the current carrying torsion bar for each conductor 59 and 69 is shown. Leads for the various top conductors of the array terminate near the perimeter of a wafer on which the array was formed, to facilitate electrical connections for pumping the amplifiers.

Although this disclosure has focused on teaching the preferred embodiments of the invention claimed, other embodiments and modifications of this invention will be apparent to persons of ordinary skill in the art in view of these teachings. Therefore, this invention is limited only by the following claims and their equivalents, which include all such embodiments and modifications when viewed in conjunction with the above specification and accompanying drawings.

What is claimed is:

1. A device comprising:
   a substrate;
   at least one solid-state optical amplifier attached to the substrate; and
   a plurality of mirrors attached to the substrate and moveable relative to the substrate independent of each other;
   wherein light having a wavelength within a selected range enters the device, is amplified by the amplifier and reflected by one of the mirrors to exit the device in a direction controlled by the mirror.

2. The device of claim 1, wherein the light is amplified by the amplifier before and after reflection by the mirror.

3. The device of claim 1, wherein the amplifier is attached to the mirror and moves with the mirror relative to the substrate.

4. The device of claim 1, wherein the mirror moves relative to the amplifier.

5. The device of claim 1, further comprising a photodetector disposed adjacent to the amplifier.

6. The device of claim 1, wherein the amplifier serves as a photodetector.

7. The device of claim 1, wherein a lead for the amplifier serves as a torsion bar.

8. A device comprising:
   a substrate;
   a plurality of solid-state optical amplifiers attached to the substrate; and
   a plurality of mirrors attached to the substrate and moveable relative to the substrate independent of each other, each of the mirrors being aligned with a corresponding one of the amplifiers;
   wherein light having a wavelength within a selected range enters the device, is amplified by the one amplifier and reflected by the corresponding mirror to exit the device in a direction controlled by the mirror.

9. The device of claim 8, wherein the light is amplified by the amplifier before and after reflection by the mirror.

10. The device of claim 8, wherein the amplifier is attached to the mirror and moves with the mirror relative to the substrate.

11. The device of claim 8, wherein the mirror moves relative to the amplifier.

12. The device of claim 8, further comprising a photodetector disposed adjacent to the amplifier.

13. The device of claim 8, wherein the amplifier serves as a photodetector.

14. The device of claim 8, wherein a lead for the amplifier serves as a torsion bar.

15. A device comprising:
   a substrate;
   a plurality of solid-state optical amplifiers attached to the substrate; and
   a plurality of mirrors attached to the substrate and moveable relative to the substrate independent of each other, each of the mirrors being aligned with a corresponding one of the amplifiers;
   wherein light having a wavelength within a selected range enters the device, is amplified by the one amplifier and reflected by the corresponding mirror to exit the device in a direction controlled by the mirror, with the light detected by the device.

16. The device of claim 15, wherein the light is amplified by the amplifier before and after reflection by the mirror.

17. The device of claim 15, wherein the amplifier is attached to the mirror and moves with the mirror relative to the substrate.

18. The device of claim 15, wherein the mirror moves relative to the amplifier.

19. The device of claim 15, wherein the light is detected by a photodetector that is disposed adjacent to the amplifier.

20. The device of claim 15, wherein a lead for the amplifier serves as a torsion bar.

* * * * *